(12) United States Patent
Berdiyorov et al.

(10) Patent No.: US 11,227,963 B2
(45) Date of Patent: Jan. 18, 2022

(54) CARBON BASED MATERIAL, AN OPTICAL RECTENNA AND A SEMICONDUCTOR DEVICE INCLUDING THE SAME

(71) Applicant: Qatar Foundation, Doha (QA)

(72) Inventors: Golibjon Berdiyorov, Doha (QA); Hicham Hamoudi, Doha (QA)

(73) Assignee: QATAR FOUNDATION, Doha (QA)

( * ) Notice: Subject to any disclaimer, the term of this patent is extended or adjusted under 35 U.S.C. 154(b) by 0 days.

(21) Appl. No.: 16/402,505

(22) Filed: May 3, 2019

(65) Prior Publication Data

US 2020/0350451 A1 Nov. 5, 2020

(51) Int. Cl.
*H01L 31/044* (2014.01)
*H01L 31/054* (2014.01)
*C01B 32/174* (2017.01)
*C01B 32/158* (2017.01)
*C01B 32/159* (2017.01)

(52) U.S. Cl.
CPC .......... *H01L 31/054* (2014.12); *C01B 32/158* (2017.08); *C01B 32/159* (2017.08); *C01B 32/174* (2017.08)

(58) Field of Classification Search
CPC .................. H01L 31/00–078; Y02E 10/50–60
USPC .................................................. 136/243–265
See application file for complete search history.

(56) References Cited

U.S. PATENT DOCUMENTS

| 2009/0308443 A1* | 12/2009 | Cutler .................. B82Y 10/00 136/256 |
| 2011/0203632 A1* | 8/2011 | Sen ................. H01L 31/022466 136/244 |
| 2015/0311461 A1 | 10/2015 | Cola et al. | |

OTHER PUBLICATIONS

Michekson, E.T., Huffman, C.B., Rinzler, A.G., Smalley, R.E., Hauge, R.H., Margrave, J.L. Fluorination of Single-Wall Carbon Nanotubes, Chemical Physics Letters, 296, 1998, 188-194 (Year: 1998).*

(Continued)

*Primary Examiner* — Bach T Dinh
(74) *Attorney, Agent, or Firm* — K&L Gates LLP

(57) ABSTRACT

A carbon based material, an optical rectenna and a semiconductor device including the same are provided. The carbon based material includes a carbon nanomaterial and a metal material bonded to the carbon nanomaterial, where the carbon nanomaterial includes a fluorine material.

14 Claims, 3 Drawing Sheets

(56) References Cited

OTHER PUBLICATIONS

Park, M., Kim, K. H., Lee, Y., Fluorination of Single-walled Carbon Nanotube: the Effects of Fluorine on Structural and Electrical Properties, Journal of Industrial and Engineering Chemistry, 2016, 37, 22-26. (Year: 2016).*
S. Kawasaki, K. Komatsu, F. Okino, H. Touhara, H. Kataura, Fluorination of Open-and Closed-end Single-walled Carbon Nanotubes, Phys. Chem. Chem. Phys, 2004, 6, 1769-1772. (Year: 2004).*
Etizaz Hassan Shah; Electrical Resistance in Carbon Nanotube—Insulator—Metal Diode Arrays for Optical Rectenna; Georgia Institute of Technology; Aug. 2010; (87 pages).
Kelly, et al; "Insight into the mechanism of sidewall functionalization of single-walled nanotubes: an STM study" Chemical Physics Letters; pp. 445-450; Aug. 1999; (6 pages).
Mickelson, et al.; "Flourination of single-wall carbon nanotubes"; Chemical Physics Letters; pp. 188-194; Aug. 12, 1998; (7 pages).
Sharma, et al; "A Carbon Nanotube Optical Rectenna"; School of Materials Science and Engineering, Georgia Institute of Technology; (28 pages).
Mrzhezinskaya, et al.; "Electronic Structure of Fluorinated Carbon Nanotubes"; Mar. 1, 2010; (29 pages).

* cited by examiner

C  Ag  Hf  O  F

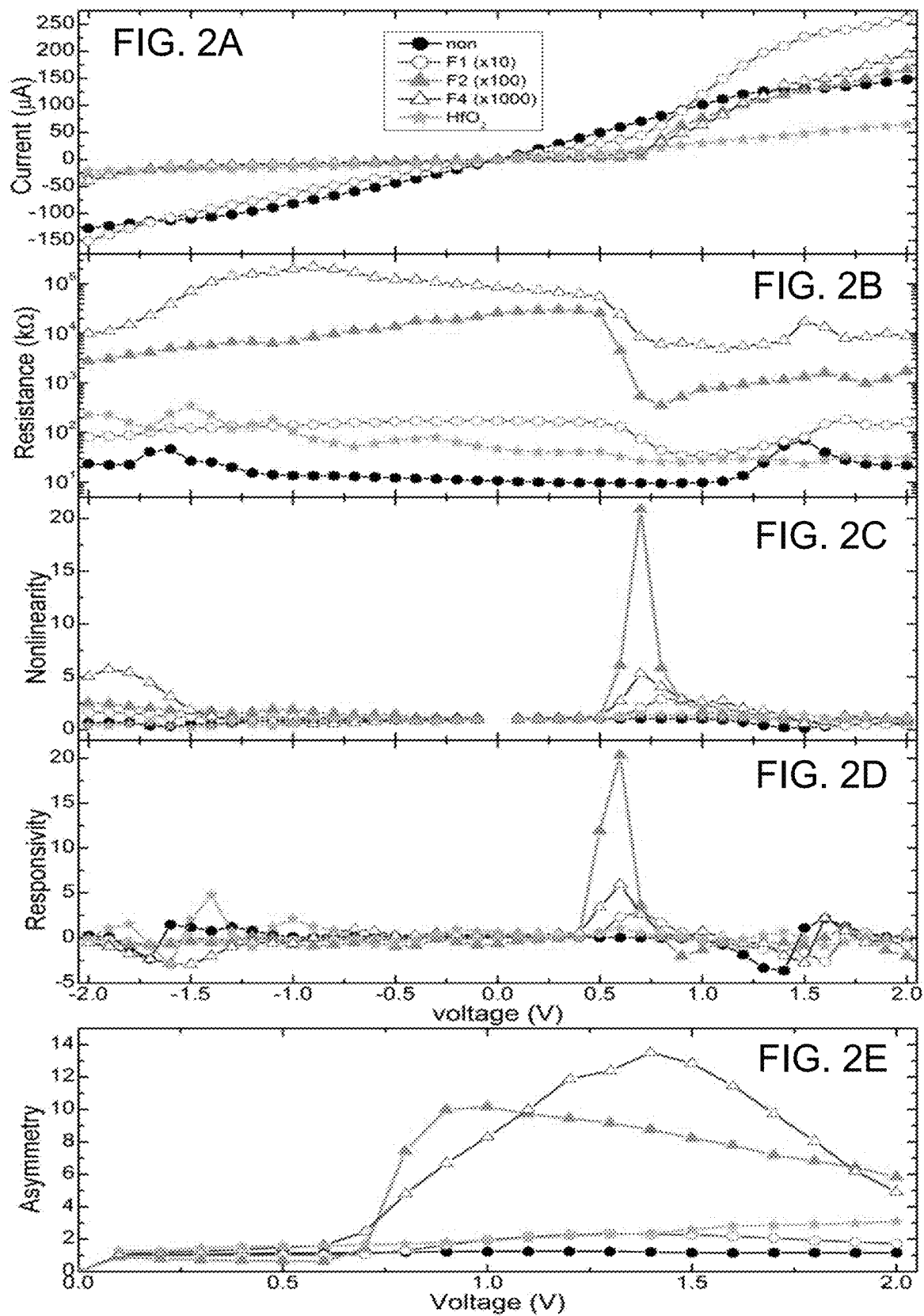

CARBON BASED MATERIAL, AN OPTICAL RECTENNA AND A SEMICONDUCTOR DEVICE INCLUDING THE SAME

BACKGROUND

The present disclosure generally relates to a carbon based material for an optical device.

An optical rectenna is a device that can convert electromagnetic radiation in optical range of spectrum into current through rectification. An optical rectenna to collect solar energy are generally known, where different approaches and development have been taken toward a practical fabrication of solar cells using optical rectennas. To date, however, there exists a need for further development in practice and in view of the difficulties and challenges for achieving large-scale nanostructures for optical application and at low cost. For example, there are two main challenges to rectenna device development. First, the antenna part of the device needs to be small enough to collect the electromagnetic radiation and to convert the signal into an alternating current. Second, the response time of the rectifying diode must be short enough to respond to the changes in the polarity of the electron oscillations in the antennas.

A carbon nanotubes (CNT)-insulator-metal diode has been developed. The CNT-insulator-metal diode is used as an optical rectenna which can operate in the optical range of the spectrum. The CNT-insulator-metal diode includes a CNT layer, an insulator layer provided between the CNT layer and a metal layer. An effort in improving the performance of the CNT-insulator-metal diode was conducted by modifying the properties of the insulator layer, such as an aluminum oxide layer. However, the CNT-insulator-metal diode as an optical rectenna still has relatively low solar energy conversion efficiency, and thus, there exists a need to improve the electrical and optical properties of the device including the CNT layer.

SUMMARY

The present disclosure generally relates to a carbon based material for an optical device.

For example, the present disclosure relates to a carbon based material, optical rectenna having the carbon based material, energy conversion devices having optical rectennas, and more particularly to high-efficiency solar cells having an array of optical rectennas capable of receiving and transmitting solar energy and converting the solar energy into direct current electricity.

In light of the present disclosure, and without limiting the scope of the disclosure in any way, in an aspect of the present disclosure, which may be combined with any other aspect listed herein unless specified otherwise, a carbon based material is provided. The carbon based material includes a carbon nanomaterial chemically bonded with a metal material, where the carbon nanomaterial includes a fluorine material.

In an aspect of the present disclosure, which may be combined with any other aspect listed herein unless specified otherwise, the carbon nanomaterial includes a carbon nanotube.

In an aspect of the present disclosure, which may be combined with any other aspect listed herein unless specified otherwise, the carbon nanotube includes a single-walled carbon nanotube.

In an aspect of the present disclosure, which may be combined with any other aspect listed herein unless specified otherwise, the carbon nanotube includes a double-walled carbon nanotube.

In an aspect of the present disclosure, which may be combined with any other aspect listed herein unless specified otherwise, the carbon nanotube includes a multi-walled carbon nanotube.

In an aspect of the present disclosure, which may be combined with any other aspect listed herein unless specified otherwise, the carbon nanotube includes open tip carbon nanotubes, capped carbon nanotubes and combinations thereof including open tip single-walled carbon nanotubes, capped single-walled, open-tip multi-walled carbon nanotubes, capped multi-walled carbon nanotubes, and combinations thereof.

In an aspect of the present disclosure, which may be combined with any other aspect listed herein unless specified otherwise, the carbon nanomaterial is chemically doped with the fluorine material.

In an aspect of the present disclosure, which may be combined with any other aspect listed herein unless specified otherwise, the fluorine material is chemically doped at an end region of the carbon nanomaterial.

In an aspect of the present disclosure, which may be combined with any other aspect listed herein unless specified otherwise, the fluorine material is chemically doped at a capped region of the carbon nanomaterial.

In an aspect of the present disclosure, which may be combined with any other aspect listed herein unless specified otherwise, a single carbon ring at an end region of the carbon nanomaterial is fluorinated.

In an aspect of the present disclosure, which may be combined with any other aspect listed herein unless specified otherwise, two carbon rings at an end region of the carbon nanomaterial are fluorinated.

In an aspect of the present disclosure, which may be combined with any other aspect listed herein unless specified otherwise, four carbon rings at an end region of the carbon nanomaterial are fluorinated.

In an aspect of the present disclosure, which may be combined with any other aspect listed herein unless specified otherwise, the metal material includes a transition metal, such as, silver.

In an aspect of the present disclosure, which may be combined with any other aspect listed herein unless specified otherwise, an optical rectenna is provided. The optical rectenna includes a diode. The diode includes a carbon nanomaterial chemically bonded with a metal material, where the carbon nanomaterial is chemically doped with a fluorine material.

In an aspect of the present disclosure, which may be combined with any other aspect listed herein unless specified otherwise, a solar cell is provided. The solar cell includes a first electrode, a second electrode and an active layer provided between the first electrode and the second electrode, where the active layer includes an optical rectenna of the present technology.

According to the present disclosure, the diode having the carbon based material demonstrates an enhanced diode effect. The present technology is safe and environmentally friendly to fabricate. In addition, the present technology can be fabricated at a lower cost as compared to conventional diodes having an insulating layer.

It should be noted that the effects of the present technology described herein should not be considered limiting, and other suitable properties relating to the present technology may be realized and as further described.

BRIEF DESCRIPTION OF THE DRAWING

Features and advantages of the present technology, including the carbon based material, the optical rectenna, and the solar cell including the same, may be better understood by reference to the accompanying drawings in which:

FIG. 1A is a two-probe configuration of pristine (3,3) CNT directly connected to 100 surface of silver; FIG. 1B is a two-probe configuration of pristine (3,3) CNT connected to 100 surface of silver through a $HfO_2$ insulating layer; FIG. 1C is a two-probe configuration of pristine (3,3) CNT directly connected to 100 surface of silver, where a single carbon ring is fluorinated before forming the junction; FIG. 1D is a two-probe configuration of pristine (3,3) CNT directly connected to 100 surface of silver, where double carbon rings are fluorinated before forming the junction; FIG. 1E is a two-probe configuration of pristine (3,3) CNT directly connected to 100 surface of silver, where four carbon rings are fluorinated before forming the junction.

FIGS. 2A to 2E illustrate characteristics of devices according to an embodiment of the present disclosure. FIG. 2A illustrates I-V curves of the devices with applied voltage from −2V to +2V; FIG. 2B illustrates differential resistance characteristics of the devices; FIG. 2C illustrates nonlinearity characteristics of the devices; FIG. 2D illustrates responsivity characteristics of the devices; FIG. 1E illustrates asymmetry characteristics of the devices.

Figure 1A:
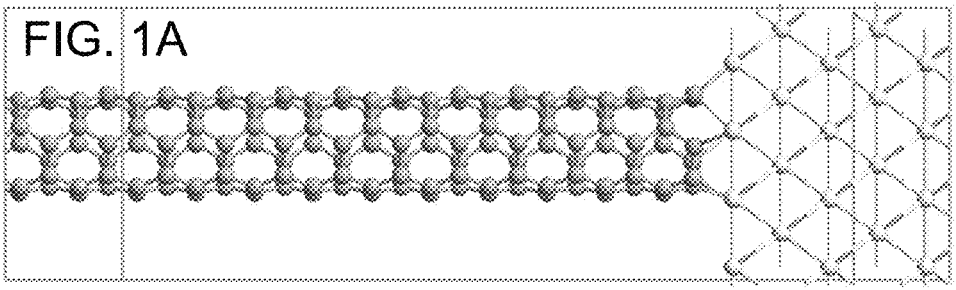
FIGS. 1A to 1E illustrate device geometries according to an embodiment of the present disclosure.

The reader will appreciate the foregoing details, as well as others, upon considering the following detailed description of certain non-limiting embodiments of the present technology including carbon based material, the optical rectenna, and the solar celling including the same. The reader may also comprehend certain of such additional details upon using the present technology including the carbon based material, the optical rectenna, and the solar celling including the same.

DETAILED DESCRIPTION

The present disclosure relates generally to a carbon based material for an optical device, such as an optical rectenna.

The embodiments disclosed herein relate to the field of energy conversion devices and more particularly to a solar cell using an optical rectenna having the carbon based material. The following definitions are used to describe various aspects and characteristics of the presently disclosed embodiments.

As referred to herein, "carbon nanotube", "carbon nanowire", and "carbon nanorod" are used interchangeably.

As referred to herein, "nanoscale" refers to distances and features below 1000 nanometers (one nanometer equals one billionth of a meter).

As referred to herein, "single-walled carbon nanotubes" (SWCNTs) refer to one graphene sheet rolled into a cylinder. "Double-walled carbon nanotubes" (DWCNTs) refer to two graphene sheets in parallel, and those with multiple sheets (typically about 3 to about 30) are referred to as "multi-walled carbon nanotubes" (MWCNTs).

As referred to herein, carbon nanotubes (CNTs) are "aligned" wherein the longitudinal axis of individual tubules are oriented in a direction substantially parallel to one another.

As referred to herein, a "tubule" is an individual carbon nanotube (CNT).

The term "linear CNTs" as used herein, refers to CNTs that do not contain branches originating from the surface of individual CNT tubules along their linear axes.

The term "array" as used herein, refers to a plurality of CNT tubules that are attached to a substrate material proximally to one another.

As referred to herein, a "transition metal" can be any suitable transition metal, transition metal alloy or mixture thereof. Examples of a transition metal include, but are not limited to, nickel (Ni), silver (Ag), gold (Au), platinum (Pt), palladium (Pd), iron (Fe), ruthenium (Ru), osmium (Os), cobalt (Co), rhodium (Rh) and iridium (Ir).

In the present disclosure, a carbon based material is provided. More specifically, the carbon based material is chemically doped to alter and improve the electronic transport properties of complex heterojunctions such as metal-carbon based material-metal diodes. The carbon based material includes a carbon nanomaterial. In an embodiment, the carbon nanomaterial includes a carbon nanotube, such as, "single-walled carbon nanotubes" (SWCNTs), "double-walled carbon nanotubes" (DWCNTs), "multi-walled carbon nanotubes" (MWCNTs), open-tip carbon nanotubes, capped carbon nanotubes, or combinations thereof.

In the present disclosure, metal-CNT-metal diode having the carbon based material for optical rectenna applications with enhanced performance is provided. In an embodiment, the metal-CNT-metal diode includes a first metal layer, a CNT layer and a second metal layer. An outer surface of the CNT near the interface between CNT layer and at least one of the metal layers is chemically doped with a fluorine material to alter and improve the electronic and optical properties of the diode. In other words, the outer surface of the CNT can be fluorinated at different suitable levels and in any suitable way. In another embodiment, the outer surface at an end region of the CNT can be chemically doped with other suitable material, such as, chlorine (Cl), bromine (Br), iodine (I), and the like.

The metal layers in the metal-CNT-metal diodes as described herein includes a metal material according to an embodiment. The metal material may include a transition metal, transition metal alloy or mixture thereof. Examples of a transition metal include, but are not limited to, nickel (Ni), silver (Ag), gold (Au), platinum (Pt), palladium (Pd), iron (Fe), ruthenium (Ru), osmium (Os), cobalt (Co), rhodium (Rh) and iridium (Ir). In preferred embodiment, the transition metal is silver (Ag).

In the present disclosure, the CNT-metal diodes demonstrate improved rectification as compared to conventional CNT-insulator-metal diodes. The present technology can be used as optical rectenna for efficient solar energy conversion application. In addition, fluorination techniques or the like is less costly and less time consuming as compared to direct evaporation of insulating layers between CNT layer and metal layer.

In the present disclosure, a CNT-based optical rectenna is developed, where the rectification effect in the CNT-metal diode is created by fluorinating the outer surface of the CNT at an end region, such as, at the interface between the CNT layer and the metal layer. Computer simulations of quantum transport properties of CNT-metal diodes according to an embodiment of the present technology are further described below.

The CNT-metal diodes of the present technology are first geometry optimized using density functional theory (DFT) within the generalized gradient approximation of Perdew-Burke-Ernzerhof (PBE) for the exchange-correlation. Atomic coordinates of fluorinated CNT are fully relaxed during the simulations and the position of metal electrodes are optimized as rigid objects. The convergence criterion for Hellman-Feynman forces is 0.05 eV/° A. The Brillouin zone is integrated using Monkhorst-Pack method and van der Waals interactions are taken into account using Grimme's empirical dispersion correction. Double-zeta-polarized basis sets of local numerical orbitals were used in the calculations. Electronic transport calculations are performed using the nonequilibrium Green's function formalism. The current-voltage (I-V) characteristics are calculated using the following Landauer-Buttiker formula:

$$I(V) = \frac{2e}{h} \int_{\mu_L}^{\mu_R} T(E, V)[f(E - \mu_L) - f(E - \mu_R)]dE, \quad (1)$$

where T(E, V) is the transmission spectrum for the given value of voltage biasing, f(E) is the Fermi-Dirac distribution function and μL/μR is the chemical potential of the left/right electrode.

I-V calculations are conducted using 5×5×100 k-point Brillouin zone sampling. From the calculated I-V curves, extracted diode figures of merit (resistance, nonlinearity, responsivity, and asymmetry) include:

$$R = \left(\frac{dI}{dV}\right)^{-1} \text{ (differential resistance)}, \quad (2)$$

$$N = \frac{dI/dV}{I/V} \text{ (nonlinearity)}, \quad (3)$$

$$\beta = \frac{1}{2}\frac{d^2I}{dV^2} \bigg/ \frac{dI}{dV} \text{ (responsivity)}, \quad (4)$$

$$A = \left|\frac{I(+V)}{I(-V)}\right| \text{ (asymmetry)}, \quad (5)$$

where the asymmetry is defined as the forward-to-reverse current ratio.

Transport calculations are performed on device geometries including left and right regions (i.e., electrodes), which are connected to a central region (i.e. two-probe configuration).

Figure 1B:
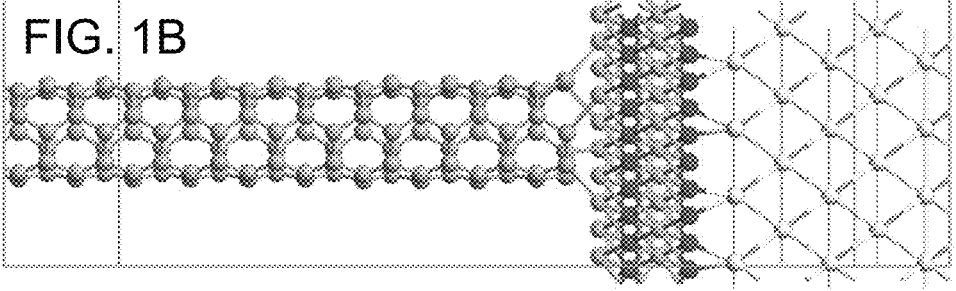
Figure 1C:
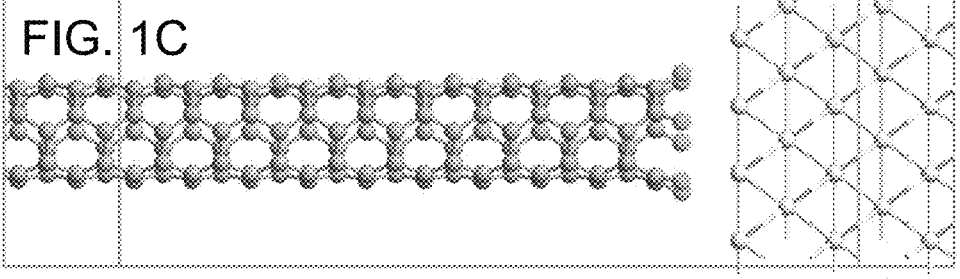
Figure 1D:
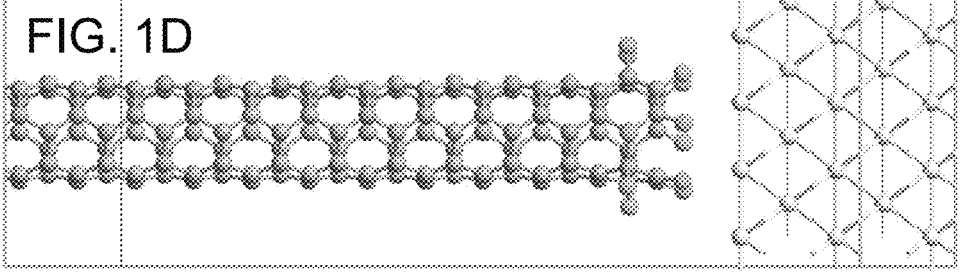
Figure 1E:
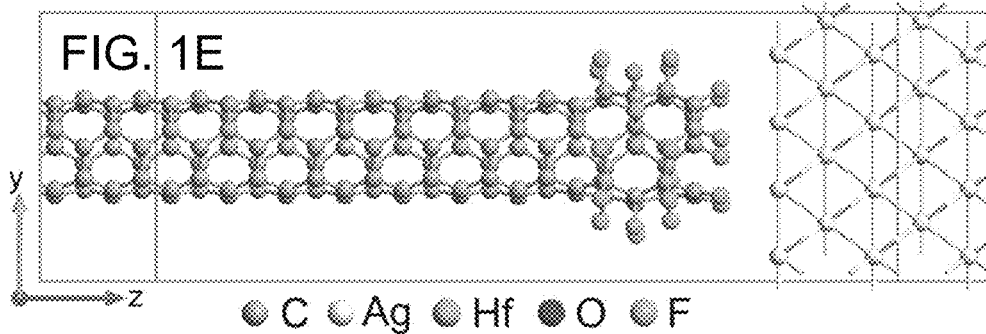

FIGS. 1A-1E illustrate device geometries according to embodiments of the present disclosure. FIG. 1A is a two-probe configuration of pristine (3,3) CNT directly bonded to 100 surface of silver metal; FIG. 1B is a two-probe configuration of pristine (3,3) CNT bonded to 100 surface of silver metal through a HfO$_2$ insulating layer; FIG. 1C is a two-probe configuration of pristine (3,3) CNT directly bonded to 100 surface of silver, where a single carbon ring is fluorinated before forming the diode junction; FIG. 1D is a two-probe configuration of pristine (3,3) CNT directly bonded to 100 surface of silver, where double carbon rings are fluorinated before forming the diode junction; FIG. 1E is a two-probe configuration of pristine (3,3) CNT directly bonded to 100 surface of silver, where four carbon rings are fluorinated before forming the diode junction.

FIGS. 2A to 2E illustrate characteristics of diodes having a two-probe configuration according to an embodiment of the present technology. Filled-black circle represents a diode having a two-probe configuration of pristine (3,3) CNT directly bonded to 100 surface of silver metal without fluorination. Open-red circle represents a diode having a two-probe configuration of pristine (3,3) CNT directly bonded to 100 surface of silver metal, where an end surface of the CNT near the interface between the CNT and the metal layer is fluorinated at a first level. Filled-green triangle represents a diode having a two-probe configuration of pristine (3,3) CNT directly bonded to 100 surface of silver metal, where an end surface of the CNT near the interface between the CNT and the metal layer is fluorinated at a second level higher than the first level. Open-purple triangle represents a diode having a two-probe configuration of pristine (3,3) CNT directly bonded to 100 surface of silver metal, where an end surface of the CNT near the interface between the CNT and the metal layer is fluorinated at a third level higher than the second level. Cyan star represents a diode having a two-probe configuration of pristine (3,3) CNT directly bonded to 100 surface of silver metal through a hafnium dioxide (HfO$_2$) insulating layer.

FIG. 2A illustrates the I-V curves of the diodes for the range of applied voltage −2 V to +2 V. As illustrated in FIG. 2A, introduction of the insulating layer decreases the current as compared to the diodes without the insulating layer hafnium dioxide. For example, the filled-black circles curve shows a higher current in comparison with the cyan stars curve due to the creation of potential barrier for the electrons to transport through the diode junction. Fluorination also decreases the current in the diodes where the current value is directly proportional to the level of fluorine doping.

In FIG. 2B, the differential resistance characteristics of the diode samples are illustrate. As illustrated in FIG. 2B, edge fluorination gives similar differential resistance as compared to the CNT-HfO$_2$—Ag diode (open-red circles curve vs. cyan stars curve). Differentia resistance increases further with increasing the fluorine doping level. However, the differential resistance reduces considerably starting from bias voltage +0.5 V, where the fluorination gives largest nonlinearity and responsivity as illustrated in FIGS. 2C and 2D.

In FIG. 2E, the asymmetry in the I-V curves defined as the ratio of the forward current to the reverse current is illustrated to estimate the level of rectification. As illustrated in FIG. 2E that the fluorination of the CNT results in dramatic enhancement of the rectification effect in comparison with the non-fluorinated diode. For example, only the diode with edge fluorination gives the asymmetry level more than 2 (open-red circles curve), whereas the maximum forward-to-reverse current ratio does not exceed 26% in the case of undoped diode (filled-black circles curve). The rectification effect enhances further with increasing the level of fluorine doping. The asymmetry becomes more than an order of magnitude depending on the value of the applied bias. Thus, as shown in FIG. 2E, the diode properties of fluorinated samples are much improved in comparison with the CNT-insulator-metal diode without fluorination.

Figure 3:
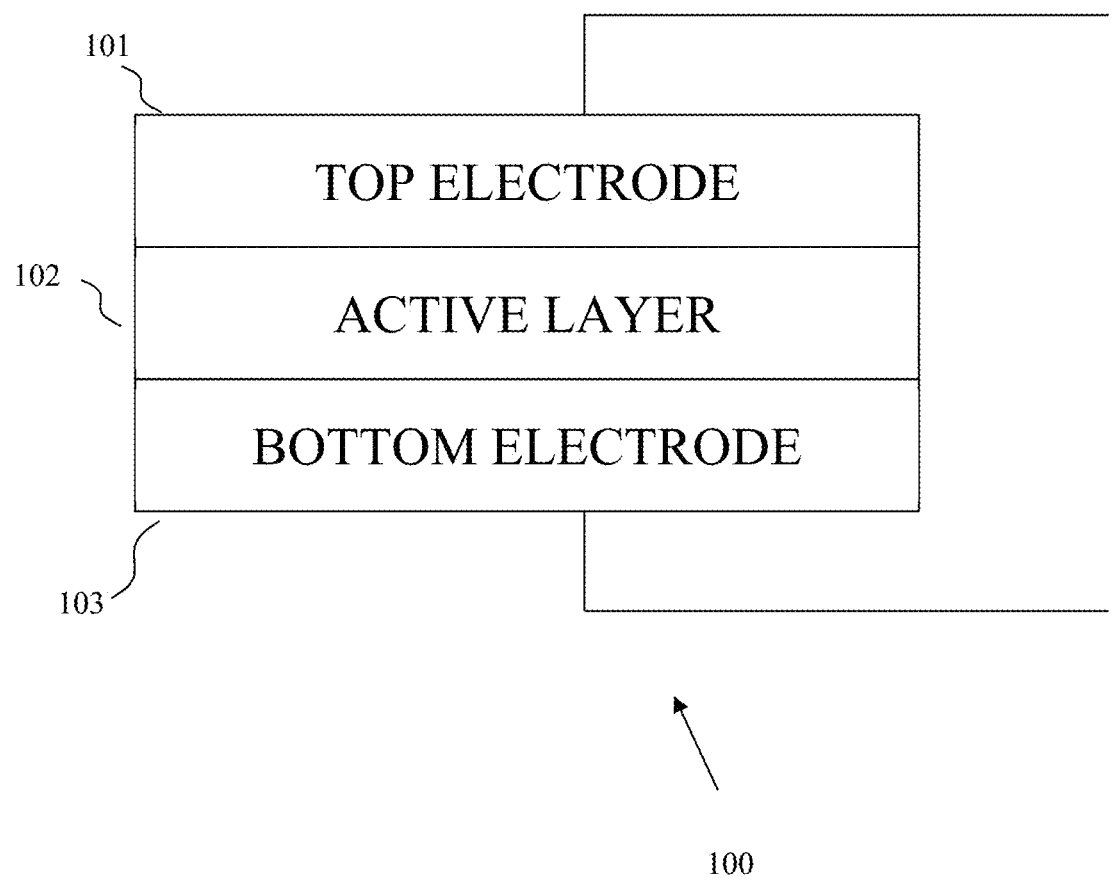
FIG. 3 is a cross section side view illustrating a semiconductor device according to an embodiment of the present disclosure.

FIG. 3 illustrates a semiconductor device according to an embodiment of the present disclosure. In implementations, a semiconductor device 100 can include, but are not limited to, optical devices such as photovoltaic devices, photodetectors, solar cells and so forth. As illustrated in FIG. 3, the semiconductor device 100 may include a top electrode 101, a bottom electrode 103, and an active layer 102 disposed between the top electrode 101 and the bottom electrode 103. The top electrode 101 may function as a cathode electrode. The bottom electrode 103 may function as an anode electrode. However, the top electrode 101 may function as an anode electrode, and the bottom electrode 103 may function as a cathode electrode in another embodiment.

In certain specific embodiments, the top electrode 101 can include an Al layer and/or an Ag layer that functions as an anode, and the bottom electrode 103 can include an indium-tin oxide (ITO) layer that functions as a cathode. In other specific embodiments, the top electrode 101 can include an indium-tin oxide (ITO) layer that functions as an anode, and the bottom electrode 103 can include an aluminum layer that functions as a cathode. Other materials may also be used to form the top electrode 101, such as calcium, magnesium, lithium, sodium, potassium, strontium, cesium, barium, iron, cobalt, nickel, copper, silver, zinc, tin, samarium, ytterbium, chromium, gold, graphene, an alkali metal fluoride, an alkaline-earth metal fluoride, an alkali metal chloride, an alkaline-earth metal chloride, an alkali metal oxide, an alkaline-earth metal oxide, a metal carbonate, a metal acetate, and/or a combination of two or more of the above materials. Further, other materials may be used to form the bottom electrode 103 (or a transparent electrode), such as fluorine-doped tin oxide (FTO), aluminum-doped zinc oxide (AZO), antimony-tin mixed oxide (ATO), a conductive polymer, a network of metal nanowire, a network of carbon nanowire, nanotube, nanosheet, nanorod, carbon nanotube, silver nanowire, or graphene.

The semiconductor device 100 may include an active layer 102, which can include a carbon based material or a diode including the carbon based material or an optical rectenna including the carbon based material according to an embodiment of the present technology. In implementations, the active layer 102 serves to absorb light and convert into electricity.

It should be understood that various changes and modifications to the presently preferred embodiments described herein will be apparent to those skilled in the art. Such changes and modifications can be made without departing from the spirit and scope of the present subject matter and without diminishing its intended advantages. It is therefore intended that such changes and modifications be covered by the appended claims.

The invention is claimed as follows:

1. A carbon based material for an optical rectenna device, the carbon based material comprising:
   a carbon nanomaterial and a metal material directly bonded to the carbon nanomaterial,
   wherein the carbon nanomaterial includes a carbon nanotube (CNT),
   wherein the CNT includes:
      a metallic CNT part, and
      a fluorinated CNT part disposed between the metallic CNT part and the metal material, wherein the metallic CNT part, the fluorinated CNT part, and the metal material form a metallic CNT-insulator-metal diode,
   wherein the CNT comprises an open-tip CNT,
   wherein the fluorinated CNT part comprises an end region of the open-tip CNT chemically doped with a fluorine material, and
   wherein the metal material includes a surface facing the CNT and the CNT is vertically aligned and perpendicular to the surface of the metal material.

2. The carbon based material of claim 1, wherein the CNT includes a single-walled CNT.

3. The carbon based material of claim 1, wherein the CNT includes a double-walled CNT.

4. The carbon based material of claim 1, wherein the CNT includes a multi-walled CNT.

5. The carbon based material of claim 1, wherein at least one carbon ring of the carbon nanomaterial is fluorinated with the fluorine material.

6. The carbon based material of claim 1, wherein the metal material includes a transition metal.

7. The carbon based material of claim 6, wherein the transition metal is silver.

8. An optical rectenna comprising:
   a metallic CNT-insulator-metal diode including:
      a carbon nanomaterial and a metal material directly bonded to the carbon nanomaterial,
   wherein the carbon nanomaterial includes a carbon nanotube (CNT),
   wherein the CNT includes:
      a metallic CNT part; and
      a fluorinated CNT part disposed between the metallic CNT part and the metal material, wherein the metallic CNT part, the fluorinated CNT part, and the metal material form the metallic CNT-insulator-metal diode,
   wherein the CNT comprises an open-tip CNT, and
   wherein the fluorinated CNT part comprises an end region of the open-tip CNT chemically doped with a fluorine material, and
   wherein the metal material includes a surface facing the CNT and the CNT is vertically aligned and perpendicular to the surface of the metal material.

9. The optical rectenna of claim 8, wherein the CNT is selected from the group consisting of a single-walled CNT, a double-walled CNT, a multi-walled CNT, and combinations thereof.

10. The optical rectenna of claim 8, wherein at least one carbon ring of the carbon nanomaterial is fluorinated with the fluorine material.

11. The optical rectenna of claim 8, wherein the metal material includes a transition metal.

12. The optical rectenna of claim 11, wherein the transition metal is silver.

13. A partially fluorinated CNT rectenna device comprising:
   a first electrode, a second electrode, and a partially fluorinated CNT between the first electrode and the second electrode,
   wherein the partially fluorinated CNT includes the optical rectenna according to claim 8.

14. The partially fluorinated CNT rectenna device of claim 13, wherein the partially fluorinated CNT rectenna device is a rectenna solar cell.

* * * * *